(12) United States Patent
Stanzmann

(10) Patent No.: US 11,452,214 B2
(45) Date of Patent: Sep. 20, 2022

(54) PRINTED CIRCUIT BOARD

(71) Applicant: Hella GmbH & Co. KGaA, Lippstadt (DE)

(72) Inventor: Ralf Stanzmann, Langenberg (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 0 days.

(21) Appl. No.: 16/335,027

(22) PCT Filed: Oct. 13, 2017

(86) PCT No.: PCT/EP2017/076219
§ 371 (c)(1),
(2) Date: Mar. 20, 2019

(87) PCT Pub. No.: WO2018/073128
PCT Pub. Date: Apr. 26, 2018

(65) Prior Publication Data
US 2019/0254175 A1    Aug. 15, 2019

(30) Foreign Application Priority Data
Oct. 18, 2016  (DE) ...................... 10 2016 119 825.0

(51) Int. Cl.
*H05K 3/00* (2006.01)
*H05K 3/40* (2006.01)
(Continued)

(52) U.S. Cl.
CPC ............ *H05K 3/4038* (2013.01); *H05K 1/09* (2013.01); *H05K 1/115* (2013.01); *H05K 1/144* (2013.01);
(Continued)

(58) Field of Classification Search
CPC ........ H05K 3/4038; H05K 1/09; H05K 1/115; H05K 1/144; H05K 3/0047; H05K 3/0094;
(Continued)

(56) References Cited

U.S. PATENT DOCUMENTS 5,591,353 A * 1/1997 Davignon ............ H05K 3/0094
216/17
5,699,613 A * 12/1997 Chong .................. H01L 21/486
174/264

(Continued)

FOREIGN PATENT DOCUMENTS

| CN | 101998755 A | 3/2011 |
| GB | 2202094 A | 9/1988 |
| GN | 203181403 U | 9/2013 |

OTHER PUBLICATIONS

International Search Report and Written Opinion dated Jan. 19, 2018 from corresponding PCT Application.

*Primary Examiner* — Pete T Lee
(74) *Attorney, Agent, or Firm* — Husch Blackwell LLP

(57) ABSTRACT

A printed circuit board is provided with multiple electrically conductive layers which are separated from each other by electrically non-conductive layers. At least one electrically conductive outer layer and multiple electrically conductive intermediate layers are provided. At least one electrically conductive through-connection is provided between an electrically conductive outer layer and an electrically conductive intermediate layer. The printed circuit board consists of at least one first multilayer PCB and one second multilayer PCB. The first multilayer PCB is formed from multiple electrically conductive layers and multiple electrically non-conductive layers, and the second multilayer PCB has at least one electrically conductive layer and at least one electrically non-conductive layer. The multilayer PCBs are (Continued)

connected to each other. The electrically conductive through-connection between a first electrically conductive outer layer and a second electrically conductive outer layer is formed from multilayer PCBs.

15 Claims, 2 Drawing Sheets

(51) Int. Cl.
*H05K 3/46* (2006.01)
*H05K 3/42* (2006.01)
*H05K 1/09* (2006.01)
*H05K 1/11* (2006.01)
*H05K 1/14* (2006.01)
*H05K 3/36* (2006.01)

(52) U.S. Cl.
CPC ......... *H05K 3/0047* (2013.01); *H05K 3/0094* (2013.01); *H05K 3/36* (2013.01); *H05K 3/429* (2013.01); *H05K 3/4623* (2013.01); *H05K 2201/041* (2013.01); *H05K 2201/0959* (2013.01); *H05K 2201/09536* (2013.01); *H05K 2203/061* (2013.01)

(58) Field of Classification Search
CPC ........ H05K 3/36; H05K 3/429; H05K 3/4623; H05K 2201/041; H05K 2201/09536; H05K 2201/0959; H05K 2203/06; H05K 2203/061
See application file for complete search history.

(56) References Cited

U.S. PATENT DOCUMENTS

| | | | | |
|---|---|---|---|---|
| 6,452,117 | B2 * | 9/2002 | Curcio | H01L 21/486 174/260 |
| 6,894,888 | B2 * | 5/2005 | Takeuchi | B26F 1/02 361/301.4 |
| 7,443,035 | B2 * | 10/2008 | Yamamoto | H05K 3/4061 257/774 |
| 7,732,712 | B2 * | 6/2010 | Yamano | H01L 25/105 174/260 |
| 8,130,507 | B2 * | 3/2012 | Origuchi | H05K 1/162 361/760 |
| 9,089,082 | B2 * | 7/2015 | Hsu | H05K 3/4697 |
| 2006/0180346 | A1 | 8/2006 | Knight et al. | |
| 2007/0199195 | A1 * | 8/2007 | Davis | H05K 3/445 29/830 |
| 2009/0007425 | A1 * | 1/2009 | Shinada | H05K 3/4614 29/843 |
| 2018/0206347 | A1 * | 7/2018 | Tannehill | H01B 1/22 |

* cited by examiner

PRINTED CIRCUIT BOARD

CROSS REFERENCE

This application claims priority to PCT Application No. PCT/EP2017/076219, filed Oct. 13, 2017, which itself claims priority to German Patent Application 10 2016 119825.0, filed Oct. 18, 2016, the entirety of both of which are hereby incorporated by, reference.

FIELD OF THE INVENTION

The invention concerns a printed circuit board, in particular a multilayer PCB.

BACKGROUND

Printed circuit boards with multiple conductive layers, which are separated from each other by non-conductive layers, are established in the current state of technology. They are also called multilayer PCBs. They usually have at least one conductive outer layer and multiple conductive intermediate layers, where at least one conductive through-connection is provided between a conductive outer layer and a conductive first intermediate layer. Such designs have become known, for example, through CN 203181403 U. Such through-connections are formed by drilling deeply into the printed circuit board up to the intermediate layer, in which an electrically conductive sleeve is formed. The drilling depth must be controlled so that the hole does not go too deep or not deep enough. This increases the effort and cost, because each printed circuit board has to be drilled individually with extreme precision, down to the micron, using flat-tipped drill bits as special tools. This is time-consuming and cost-intensive. Through-connections that go completely through the printed circuit board are also established. These involve drilling a through-bore in which an electrically conductive sleeve is formed.

In the case of a through-connection made by deep drilling, the width or diameter of the sleeve that is used depends on the drilling depth. The diameter of the sleeve increases more than proportionally to the drilling depth. This means the diameter of the sleeve has to be larger for deep drilling. This increases the dimensions of the printed circuit board, thereby increasing the housing of the control device and thus the required installation space in the vehicle. It is also a disadvantage that the sleeves are not cleanly sealed to the outside, which causes problems for further mounting and durability. Furthermore, it is a disadvantage that such deep drilling cannot be cleanly sealed because, in contrast to through-drilling, the filler material cannot be pressed through with deep drilling. Consequently, an air pocket is inevitably formed when the filler material is introduced. Sealing the sleeve without air is made considerably more difficult and the sleeve cannot be cleanly sealed outwardly. In the automotive area it is particularly advantageous for further mounting and durability when the sleeve is sealed flat and without inclusion of air.

SUMMARY OF THE INVENTION

Therefore, the object of the present invention is to create a printed circuit board, particularly for sensors and radar applications, that specifically satisfies the automotive requirements and has a smaller surface area and an advantageously lower weight and, in particular, is also more advantageous to manufacture and reduces the disadvantages of the current state of technology. The object is also to create a method for manufacturing a printed circuit board that enables a printed circuit board with a through-connection from an outer layer up to an intermediate layer to be manufactured easily and cost-effectively.

One embodiment of the invention concerns a printed circuit board with multiple electrically conductive layers, which are separated from each other by electrically non-conductive layers, where at least one electrically conductive outer layer and multiple electrically conductive intermediate layers are provided, where at least one electrically conductive through-connection is provided between an electrically conductive outer layer and an electrically conductive intermediate layer, where the printed circuit board consists of at least a first multilayer PCB and of a second multi layer PCB, where the first multilayer PCB is formed from multiple electrically conductive layers and multiple electrically non-conductive layers and the second multilayer PCB has at least one electrically conductive layer and at least one electrically non-conductive layer, where the multilayer PCBs are connected to each other, where the electrically conductive through-connection between a first electrically conductive outer layer and a second electrically conductive outer layer is formed from one of the multilayer PCBs.

As a result, the second outer layer forms the first intermediate layer, so that the multilayer PCB in this regard can be drilled through, so that then the sleeve can be inserted into the hole or be formed there. Deep drilling, which extends only partway into the multilayer PCB, is no longer necessary. The manufacturing process can be considerably simplified in this way, because the first multilayer PCB can be prefabricated and connected to a second multilayer PCB to form the printed circuit board.

It is especially preferable for the second multilayer PCB also to be formed from multiple electrically conductive layers and from multiple electrically non-conductive layers. As a result, it is possible to create a multilayer PCB with even more layers.

It is also advantageous for the printed circuit board to be composed of multilayer PCBs, particularly when the multilayer PCBs are glued to each other. This creates a stable printed circuit board.

In addition, the invention enables the advantage of easily, durably and essentially flatly filling an electrically conductive sleeve with a filler material. This means the filling can essentially be carried out completely so that the sleeve can also be reliably provided with an electrically conductive cover on which, from the automotive point of view, a component can be reliably mounted, for example, through soldering.

The minimum of two multilayer PCBs that are used can be formed as separately pressed elements that are connected to each other. Thus, a repeatedly pressed printed circuit board is created, which particularly can be used for and is advantageous for automotive sensors and/or HF automotive applications. Such primed circuit boards can also be used for applications outside of the automotive area.

This enables miniaturization of automotive-grade multilayer PCBs, preferably high-frequency 24 GHZ, and 77 GHZ radar applications. The printed circuit board as defined by this invention can also be applied to other areas of application, particularly in the automotive area, preferably in product areas or for special applications with limited installation space. The design leads to miniaturization of the control devices and/or sensors and thereby reduces the required installation space in the vehicle. Consequently, it leads both directly and indirectly to cost savings and weight reduction.

It is advantageous for at least two multilayer PCBs, at least a first multilayer PCB and a second multilayer PCB, to be glued together or connected in some other way. This forms the printed circuit board from prepared multilayer PCBs, where one, namely the first multilayer PCB, forms the aforementioned through-connection, where also the second multilayer PCB can form the aforementioned through-connection or such a through-connection or a through-connection of another type.

It is preferable for multiple through-connections to be provided in one and/or the other multilayer PCB, which are connected to each other to form the printed circuit board.

It is also expedient for the through-connection to be arranged in the first multilayer PCB, where the second multilayer PCB, in connection with the through-connection of the first multilayer PCB, can have either no through-connection or one or more through-connections of the same type or of different types, depending on the requirement. Gluing the two multilayer PCBs turns the through-connection into a blind through-connection, because it ends in the stack of layers and does not extend to the outside on one side.

It is also expedient for the through-connection of the first multilayer PCB to be sealed on one side by the second multilayer PCB. This creates a sealed end.

Furthermore, it is advantageous for an embodiment when the through-connection on the outer side of the first multilayer PCB is completely sealed by a filler material enriched with an adhesive, particularly without air pockets, and when it is covered by a conductive layer. As a result, an electronic component can also be placed above the through-connection, which leads to a considerable reduction of the PCB surface area and directly reduces PCB costs and weight.

In a further embodiment, it is expedient when the conductive layer for the cover is a copper layer, in particular a copper layer with a solder mask, or is a copper layer with a surface coating, in particular a copper layer with a surface coating and with a solder mask. As a result, the through-connection can be reliably sealed and prepared for placement of electronic components.

It is also expedient for the through-connection to be formed by a through-drilling of the first multilayer PCB, into which a conductive sleeve is inserted or formed through electroplating. This is advantageous because it enables even multiple such multilayer PCBs to be simultaneously machined or drilled as a stack. This reduces the effort and costs.

It is also particularly advantageous when the conductive sleeve is essentially completely filled by a filler material, such as a filler material enriched with an adhesive, and it is also particularly advantageous when this is done without air pockets or with only few air pockets. As a result, it is possible to achieve a sealed end without an air pocket or without a vacuum, which enables reliable mounting on the sleeve, increases operating reliability and satisfies the automotive requirement.

It is also expedient when the minimum of one first multilayer PCB and the second multilayer PCB are glued together by an adhesive. Then the same adhesive can be used for gluing or pressing and for filling the conductive sleeve. Where appropriate, this can also be done in the same process step. Alternatively, the sleeve can be filled in a separate process step so that afterwards the printed circuit boards can be glued together.

It is particularly advantageous when the printed circuit board as defined by the invention is provided for use in control devices or sensors, in particular for automotive applications, in particular as radar sensors or control units for radar sensors.

The object with regard to the method is handled by the features in accordance with claim 14.

An embodiment of the invention concerns a method for manufacturing a printed circuit board with multiple electrically conductive layers, which are separated from each other by electrically non-conductive layers, where at least one electrically conductive outer layer and multiple electrically conductive intermediate layers are provided, where at least one electrically conductive through-connection is provided between an electrically conductive outer layer and an electrically conductive intermediate layer, where the method for manufacturing a printed circuit board involves the provision of at least a first multilayer PCB and at least a second multilayer PCB, where the first multilayer PCB is formed from multiple electrically conductive layers and multiple electrically non-conductive layers and the second multilayer PCB has at least one electrically conductive layer and at least one electrically non-conductive layer, where the electrically conductive through-connection between a first electrically conductive outer layer and a second electrically conductive outer layer is formed from one of the multilayer PCBs and where the multilayer PCBs are connected to each other.

Here, it is particularly advantageous when the minimum of one first multilayer PCB and the minimum of one second multilayer PCB are connected to each other, specifically by gluing them together.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE DRAWINGS

Figure 1:
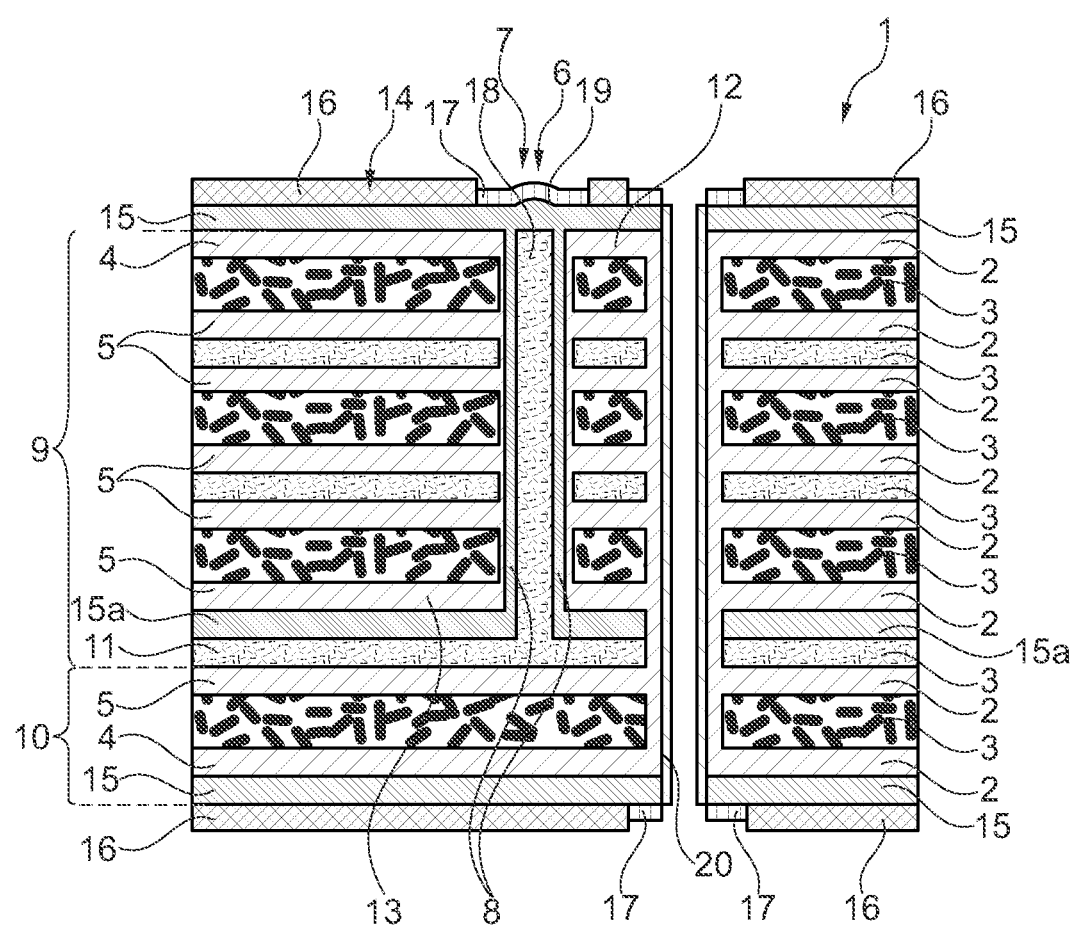
FIG. 1 shows a schematic diagram of a cut-out of an embodiment of a printed circuit board as defined by the invention.

FIG. 1 shows a schematic diagram with a cut-out of a printed circuit board 1 as defined by the invention with multiple electrically conductive layers 2, which are separated from each other by non-conductive layers 3.

At least one electrically conductive outer layer 4 and multiple electrically conductive intermediate layers 5 are included. The illustrated embodiment includes eight electrically conductive layers 2, i.e. two electrically conductive outer layers 4 and six electrically conductive intermediate layers 5.

An electrically conductive through-connection 6 can be seen. This illustrated through-connection 6 represents an example for at least one electrically conductive through-connection 6 formed between an electrically conductive outer layer 4 and an electrically conductive first intermediate layer 5. It is preferable to provide for multiple such through-connections 6. The through-connection 6 is formed by a drilled hole 7 with an electroplated electrically conductive sleeve 8.

The printed circuit board 1 as defined by the invention is composed of a first multilayer PCB 9 and a second multilayer PCB 10, each of which is formed from multiple electrically conductive layers 2 and multiple non-conductive layers 3, where the minimum of two multilayer PCBs 9, 10 are connected to each other. This is accomplished by the non-conductive layer 11, which is particularly enriched with adhesive. At least one first multilayer PCB 9 and one second multilayer PCB 10 are advantageously glued together or connected in some other way.

The through-connection 6 is formed as defined by the invention between a first electrically conductive outer layer 12 and a second electrically conductive outer layer 13 of one of the multilayer PCBs 9. As a result, this multilayer PCB 9 can be drilled through and the electrically conductive sleeve 8 can be formed. This is accomplished by an electroplating process.

Figure 2:
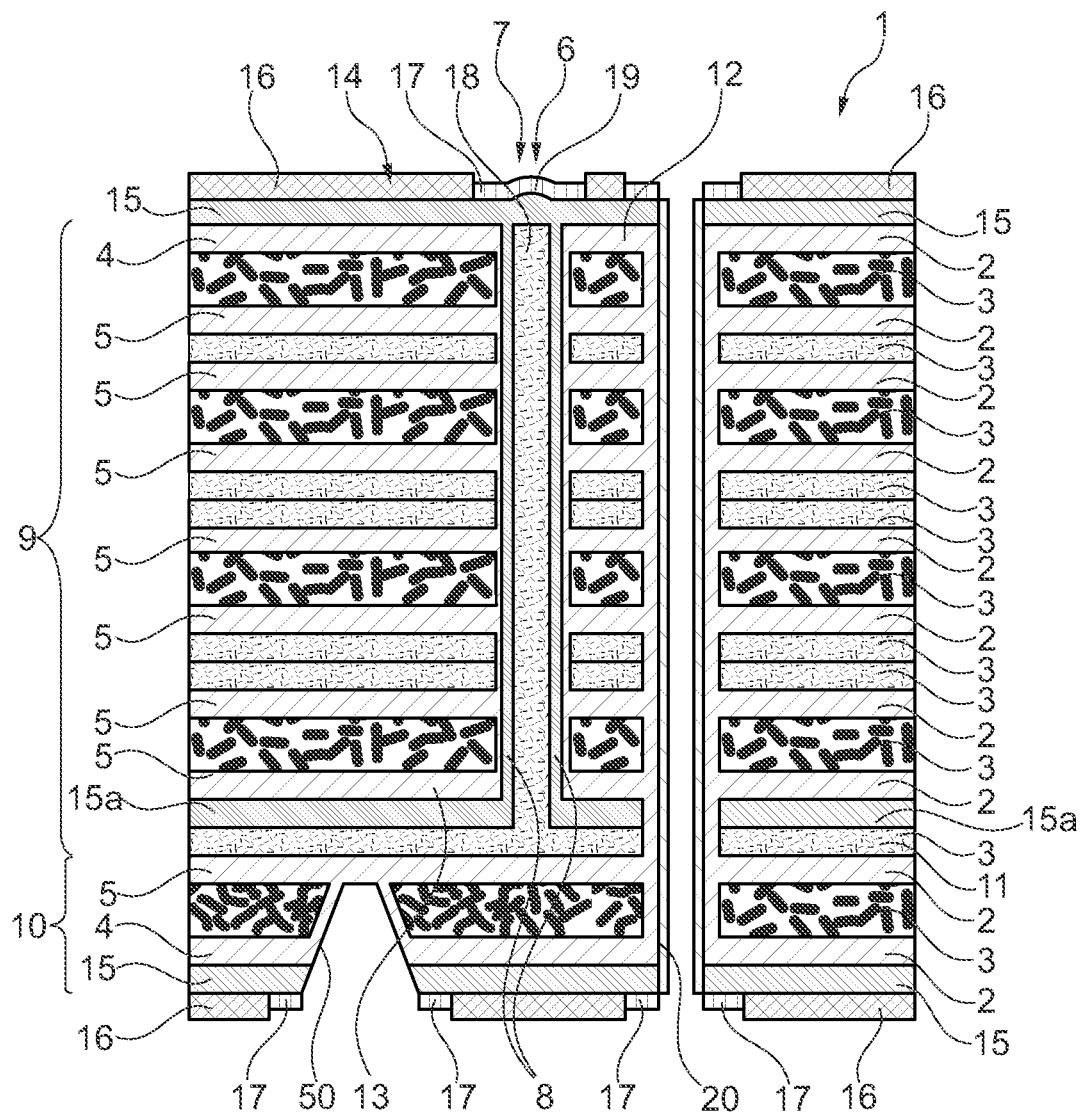
FIG. 2 shows a schematic diagram of a cut-out of an embodiment of a printed circuit board as defined by the invention.

In FIG. 1, for example, the through-connection 6 is arranged in the first multilayer PCB 9, where the second multilayer PCB 10 in connection with the through-connection 6 of the first multilayer PCB 9 has no electrically conductive through-connection. As shown in FIG. 2, however, the second multilayer PCB 10 can also have an electrically conductive through-connection 50 or even multiple electrically conductive through-connections, even of various types, depending on the requirement.

In FIG. 1, the second multilayer PCB 10 closes the through-connection 6 in a middle area of the printed circuit board 1. Thus the through-connection 6 of the first multilayer PCB 9 is closed on one side by the non-conductive layer 11, which is enriched with adhesive, and the second multilayer PCB 10.

It can also be seen that the through-connection 6, which is filled or closed with a filler material 18, is reliably covered by a conductive layer 15 on the outer side 14 of the first multilayer PCB 9. Such a layer is also found on the other side of the first multilayer PCB 9 and on the opposite side of the second multilayer PCB 10. For a cover, therefore, the electrically conductive layer 2 as an outer layer 4 has a copper layer as a cover or layer 15, in particular a copper layer as layer 15 with a solder mask 16, or a copper layer as layer 15 with a surface coating 17, in particular a copper layer 15 with surface coating 17 and with a solder mask 16.

The through-connection 6 is formed in accordance with the embodiment by through-drilling the first multilayer PCB 9, in which an electrically conductive sleeve 8 is formed. The sleeve 8 is filled with a filler material 18, specifically one that has been enriched with an adhesive. The adhesive-enriched layer 11 is used for gluing at least one first multilayer PCB 9 and the second multilayer PCB 10. The adhesive-enriched filler material can also be used partially as a filler material 18 for the through-connection 6.

The printed circuit board 1 is preferably provided for use in control devices or as sensors, particularly for automotive applications, particularly as radar sensors or control units for radar sensors.

The through-connection has a metallic, electrically conductive cover 19, as a cap, which also enables electronic components to be placed directly over the through-connection.

If the through-connection is created by drilling through the first multilayer PCB, the drilling diameter can be the same and small. It is advantageous for the drilling diameter or hole diameter also to be independent of the drilling depth.

It is extremely advantageous that the respective first multilayer PCBs can be stacked and drilled through and no longer need to be drilled individually using special tools with high precision and depth-control. This reduces the manufacturing costs.

FIG. 2 shows another embodiment of a printed circuit board 1, which essentially corresponds to the embodiment in FIG. 1, where a through-connection 50 is additionally provided in the area of the second multilayer PCB 10. Otherwise, reference is made to the description for FIG. 1.

In accordance with the definition of the invention, it is particularly advantageous when the electrically conductive through-connection 6 is filled or closed with a filler material 18, which is particularly enriched with an adhesive, and is particularly provided with an electrically conductive cover 19.

The printed circuit board is manufactured, for example, using a method as defined by the invention, in which at least a first multilayer PCB is provided and in which the through-connection from an electrical outer layer of the first multilayer PCB to the other electrical outer layer of the first multilayer PCB is either already inserted or is manufactured. This involves drilling through at least a first multilayer PCB to create a hole that, for example, is metallically coated on the edge side by metalizing or electroplating. Alternatively, it is also possible to insert a solid sleeve or the like.

Following this, it is preferable for the through-connection to be filled with a filler material and closed on either one or both sides.

Then at least a second multilayer PCB can be provided that is connected to the minimum of one first multilayer PCB so that the minimum of two multilayer PCBs are connected to each other and form a stack of electrically conductive layers and electrically non-conductive layers. The connection is preferably made by gluing.

The arrangement is to be designed so that the through-connection of the first multilayer PCB is arranged so that it ends in a more middle area of the interconnected multilayer PCBs and thus forms a through-connection from an outer layer of the first multilayer PCB and into a middle area of the printed circuit board.

The method for manufacturing a printed circuit board with multiple electrically conductive layers, which are separated from each other by electrically non-conductive layers, where at least one electrically conductive outer layer and multiple electrically conductive intermediate layers are provided, where at least one electrically conductive through-connection is provided between an electrically conductive outer layer and an electrically conductive intermediate layer, involves the provision of at least one first multilayer PCB and at least one second multilayer PCB, where the first multilayer PCB is formed from multiple electrically conductive layers and multiple electrically non-conductive layers and the second multilayer PCB has at least one electrically conductive layer and at least one electrically non-conductive layer, where the electrically conductive through-connection between one first electrically conductive outer layer and one second electrically conductive outer layer is formed from one of the multilayer PCBs and where the multilayer PCBs are connected to each other.

It is also provided for that the minimum of one first multilayer PCB and the minimum of one second multilayer PCB are connected to each other, specifically by gluing them together.

The printed circuit board created in this way from multiple multilayer PCBs can have at least one more through-connection 20 inserted from an outer layer of the printed circuit board to an opposite outer layer of the printed circuit board by drilling through the printed circuit board to create a hole that is then metalized or electroplated. Alternatively, it is also possible to insert a sleeve. It is preferable for this through-connection 20 to be formed without a filler.

REFERENCE NUMERAL LIST

1 Printed circuit board
2 Electrically conductive layer
3 Electrically non-conductive layer enriched with adhesive (prepreg)
4 Outer layer
5 intermediate layer
6 Through-connection
7 Drilled hole
8 Electrically conductive sleeve
9 Multilayer PCB
10 Multilayer PCB
11 Electrically non-conductive layer enriched with adhesive (prepreg)
12 Outer layer
13 Outer layer
14 Outer side
15 Electrically conductive layer
15a Electrically conductive layer
16 Solder mask
17 Surface coating
18 Adhesive-enriched filler material
19 Electrically conductive cover
20 Through-connection
50 Through-connection

The invention claimed is:

1. A printed circuit board comprising:
multiple electrically conductive layers separated from each other by electrically non-conductive layers, said multiple electrically conductive layers including at least one electrically conductive outer layer and multiple electrically conductive intermediate layers; and
a first electrically conductive through-connection between the at least one electrically conductive outer layer and one of the multiple electrically conductive intermediate layers, wherein the first electrically conductive through-connection includes an electrically conductive sleeve and a sealed end,
wherein the printed circuit board includes at least a first multilayer PCB and a second multilayer PCB, where the first multilayer PCB and the second multilayer PCB are connected to each other via an adhesive enriched layer directly between the first multilayer PCB and the second multilayer PCB, the adhesive enriched layer comprising a filler material,
wherein the first multilayer PCB is formed from multiple first ones of the electrically conductive layers including a first electrically conductive outer layer and a first electrically conductive intermediate layer, and multiple first ones of the electrically non-conductive layers, and
wherein the second multilayer PCB is formed from multiple second ones of the electrically conductive layers including a second electrically conductive outer layer and a second electrically conductive intermediate layer, and at least one of the electrically non-conductive layers,
wherein the first electrically conductive through-connection of the first multilayer PCB is in fluid communication with the adhesive enriched layer and the second multilayer PCB closes off the first electrically conductive through-connection directly at the adhesive enriched layer to create the sealed end,
wherein the filler material of the adhesive enriched layer extends upwardly into the electrically conductive sleeve.

2. The printed circuit board in accordance with claim 1, wherein the second multilayer PCB is formed from multiple second ones of the electrically non-conductive layers.

3. The printed circuit board in accordance with claim 1, wherein the first electrically conductive through-connection is arranged in the first multilayer PCB, where the second multilayer PCB in connection with the first electrically conductive through-connection of the first multilayer PCB has no through-connection or likewise has at least one second electrically conductive through-connection.

4. The printed circuit board in accordance with claim 1, wherein the first electrically conductive through-connection is covered on the outer side of the first multilayer PCB by an electrically conductive layer as a cover.

5. The printed circuit board in accordance with claim 1, wherein the electrically conductive layer for the cover is a copper layer with a solder mask, or is a copper layer with a surface coating with a surface coating and with a solder mask.

6. The printed circuit board in accordance with claim 1, wherein the first electrically conductive through-connection is formed by drilling through the first multilayer PCB, into which the electrically conductive sleeve is inserted or formed through electroplating.

7. The printed circuit board in accordance with claim 1, wherein an electrically conductive cover, which is essentially flat, is put on the electrically conductive sleeve filled with the filler material.

8. The printed circuit board in accordance with claim 7, wherein the electrically conductive cover is put on the filler material such that electronic components are directly mounted or soldered on the electrically conductive cover.

9. The printed circuit board in accordance with claim 1, wherein the filler material is enriched with an adhesive.

10. A method for manufacturing a printed circuit board with multiple electrically conductive layers which are separated from each other by electrically non-conductive layers, comprising the steps of:
providing at least one electrically conductive outer layer and multiple electrically conductive intermediate layers,;
providing at least one first electrically conductive through-connection between the at least one electrically conductive outer layer and one of the multiple electrically conductive intermediate layer, wherein the first electrically conductive through-connection includes an electrically conductive sleeve and a sealed end,
providing at least a first multilayer PCB and a second multilayer PCB, where the first multilayer PCB and the second multilayer PCB are connected to each other via an adhesive enriched layer directly between the first multilayer PCB and the second multilayer PCB, the adhesive enriched layer comprising a filer material;
forming the first multilayer PCB from multiple first ones of the electrically conductive layers including a first electrically conductive outer layer and a first electrically conductive intermediate layer;
forming the second multilayer PCB from multiple second ones of the electrically conductive layers including a second electrically conductive outer layer and a second electrically conductive intermediate layer, and at least one of the electrically non-conductive layer;

providing the adhesive enriched layer in fluid communication with the first electrically conductive through-connection of the first multilayer PCB;

positioning the second PCB to close off the first electrically conductive through-connection directly at the adhesive enriched layer to creat the sealed end; and filling the electrically conductive sleeve with the filler material such that the filler material of the adhesive enriched layer extends up into the electrically conductive sleeve.

11. The method in accordance with claim 10 further comprising providing a second electrically conductive through-connection between a first outer surface of the printed circuit board and a second outer surface of the printed circuit board.

12. The printed circuit board in accordance with claim 1 further comprising a third electrically conductive through-connection between a first outer surface of the printed circuit board and a second outer surface of the printed circuit board.

13. The printed circuit board in accordance with claim 1, wherein the first electrically conductive intermediate layer is positioned in between two of the multiple electrically non-conductive layers and directly abuts the two of the multiple electrically non-conductive layers.

14. The printed circuit board in accordance with claim 10, wherein the first electrically conductive intermediate layer is positioned in between two of the multiple electrically non-conductive layers and directly abuts the two of the multiple electrically non-conductive layers.

15. A printed circuit board comprising:

multiple electrically conductive layers separated from each other by electrically non-conductive layers, said multiple electrically conductive layers including at least one electrically conductive outer layer and multiple electrically conductive intermediate layers;

a first electrically conductive through-connection between the at least one electrically conductive outer layer and one of the multiple electrically conductive intermediate layer, wherein the first electrically conductive through-connection includes an electrically conductive sleeve;

the printed circuit board includes at least a first multilayer PCB and a second multilayer PCB, where the first multilayer PCB and the second multilayer PCB are connected to each other;

the first multilayer PCB is formed from multiple electrically conductive layers including a first electrically conductive outer layer and a first electrically conductive intermediate layer, and multiple electrically non-conductive layers; and the second multilayer PCB is formed from multiple electrically conductive layers including a second electrically conductive outer layer and a second electrically conductive intermediate layer, and at least one electrically non-conductive layer, wherein the first electrically conductive through-connection of the first multilayer PCB is in fluid communication with an adhesive enriched layer consisting of a filler material, and the adhesive enriched layer is positioned directly between the first multilayer PCB and the second multilayer PCB, wherein the electrically conductive sleeve is filled with the filler material of the adhesive enriched layer.

* * * * *